(12) United States Patent
Lee et al.

(10) Patent No.: US 11,299,572 B2
(45) Date of Patent: Apr. 12, 2022

(54) BLOCK COPOLYMER

(71) Applicant: LG Chem, Ltd., Seoul (KR)

(72) Inventors: Je Gwon Lee, Daejeon (KR); No Jin Park, Daejeon (KR); Jung Keun Kim, Daejeon (KR); Eun Young Choi, Daejeon (KR); Se Jin Ku, Daejeon (KR); Mi Sook Lee, Daejeon (KR); Hyung Ju Ryu, Daejeon (KR); Sung Soo Yoon, Daejeon (KR)

(73) Assignee: LG Chem, Ltd.

( * ) Notice: Subject to any disclaimer, the term of this patent is extended or adjusted under 35 U.S.C. 154(b) by 218 days.

(21) Appl. No.: 16/463,616

(22) PCT Filed: Nov. 29, 2017

(86) PCT No.: PCT/KR2017/013785
§ 371 (c)(1),
(2) Date: May 23, 2019

(87) PCT Pub. No.: WO2018/101729
PCT Pub. Date: Jun. 7, 2018

(65) Prior Publication Data
US 2020/0131296 A1 Apr. 30, 2020

(30) Foreign Application Priority Data
Nov. 30, 2016 (KR) .................. 10-2016-0162135

(51) Int. Cl.
*C08F 230/08* (2006.01)
*C08F 220/30* (2006.01)
(Continued)

(52) U.S. Cl.
CPC ...... *C08F 230/085* (2020.02); *C08F 220/301* (2020.02); *C08F 293/005* (2013.01);
(Continued)

(58) Field of Classification Search
CPC ..................................................... C08F 230/08
See application file for complete search history.

(56) References Cited

U.S. PATENT DOCUMENTS

2009/0240001 A1  9/2009  Regner
2013/0209755 A1  8/2013  Hustad et al.
(Continued)

FOREIGN PATENT DOCUMENTS

CN       101977839 A      2/2011
CN       105916904 A      8/2016
(Continued)

OTHER PUBLICATIONS

International Search Report for Application No. PCT/KR2017/013785 dated Mar. 15, 2018.
(Continued)

*Primary Examiner* — Michael F Pepitone
(74) *Attorney, Agent, or Firm* — Lerner, David, Littenberg, Krumholz & Mentlik, LLP (57) ABSTRACT

The present application can provide a block copolymer and a use thereof. The block copolymer of the present application can have excellent self-assembly properties or phase separation characteristics and excellent etching selectivity, and various other functions as required can be freely imparted thereto.

18 Claims, 4 Drawing Sheets

(51) Int. Cl.
*C08F 293/00* (2006.01)
*C08J 5/18* (2006.01)
*C08F 212/14* (2006.01)

(52) U.S. Cl.
CPC ............... *C08J 5/18* (2013.01); *C08F 212/20* (2020.02); *C08F 230/08* (2013.01); *C08F 2438/03* (2013.01)

(56) References Cited

U.S. PATENT DOCUMENTS

| | | | |
|---|---|---|---|
| 2015/0205207 A1* | 7/2015 | Seshimo | C08G 18/61 430/324 |
| 2015/0218300 A1* | 8/2015 | Kang | G03F 7/405 216/47 |
| 2016/0280832 A1 | 9/2016 | Kim et al. | |
| 2016/0280834 A1 | 9/2016 | Kim et al. | |
| 2016/0304654 A1 | 10/2016 | Lee et al. | |
| 2016/0311960 A1 | 10/2016 | Lee et al. | |

FOREIGN PATENT DOCUMENTS

| | | |
|---|---|---|
| CN | 105934456 A | 9/2016 |
| KR | 20130094264 A | 8/2013 |
| KR | 20150066486 A | 6/2015 |
| KR | 20150088203 A | 7/2015 |
| TW | 201542636 A | 11/2015 |
| WO | 2015084122 A1 | 6/2015 |
| WO | 2016066684 A1 | 5/2016 |

OTHER PUBLICATIONS

Koo, K. et al., "Directed self-assembly of Block Copolymers in the Extreme: Guiding Microdomains from the Small to the Large", Soft Matter, Accepted Jun. 21, 2013, vol. 9, No. 38, pp. 9059-9071.
Roy, X. et al., "Soluble Prussian Blue Nanoworms from the Assembly of Metal-Organic Block Ionomers", Angewandte Chemie International Edition, 2011, vol. 50, No. 7, pp. 1597-1602.
Valtola, L. et al., "Tailored surface properties of semi-fluorinated block copolymers by electrospinning", Elsevier, Polymer, Electronic Publishing May 15, 2009, vol. 50, No. 14, pp. 3103-3110.
Chinese Search Report for Application No. CN201780071835.8 dated Dec. 11, 2020.
Chinese Search Report for Application No. 201780071835.8 dated Jun. 9, 2021, 1 page (Providing English translation only).

* cited by examiner

BLOCK COPOLYMER

CROSS-REFERENCE TO RELATED APPLICATIONS

The present application is a national phase entry under 35 U.S.C. § 371 of International Application No. PCT/KR2017/013785 filed Nov. 29, 2017, which claims priority from Korean Patent Application No. 10-2016-0162135 filed Nov. 30, 2016, all of which are incorporated herein by reference.

TECHNICAL FIELD

The present application relates to a block copolymer.

BACKGROUND ART

The block copolymer has a molecular structure in which polymer segments having different chemical structures are linked via covalent bonds. The block copolymer can form a periodically arranged structure such as a sphere, a cylinder or a lamella by phase separation. The domain size of the structure formed by a self-assembly phenomenon of the block copolymer can be widely controlled and various types of structures can be manufactured, so that the block copolymer can be applied to high density magnetic storage media, nanowire fabrication, various next-generation nano devices such as quantum dots or metal dots or magnetic recording media, or pattern formation by lithography, and the like.

DISCLOSURE

Technical Problem

The present application provides a block copolymer and a use thereof.

Technical Solution

In this specification, the term alkyl group may mean an alkyl group having 1 to 20 carbon atoms, 1 to 16 carbon atoms, 1 to 12 carbon atoms, 1 to 8 carbon atoms or 1 to 4 carbon atoms, unless otherwise specified. The alkyl group may be a linear, branched or cyclic alkyl group, which may be optionally substituted with one or more substituents.

In this specification, the term alkoxy group may mean an alkoxy group having 1 to 20 carbon atoms, 1 to 16 carbon atoms, 1 to 12 carbon atoms, 1 to 8 carbon atoms or 1 to 4 carbon atoms, unless otherwise specified. The alkoxy group may be a linear, branched or cyclic alkoxy group, which may be optionally substituted with one or more substituents.

The term alkenyl group or alkynyl group herein means an alkenyl group or alkynyl group having 2 to 20 carbon atoms, 2 to 16 carbon atoms, 2 to 12 carbon atoms, 2 to 8 carbon atoms or 2 to 4 carbon atoms, unless otherwise specified. The alkenyl or alkynyl group may be linear, branched or cyclic, which may be optionally substituted with one or more substituents.

The term alkylene group herein may mean an alkylene group having 1 to 20 carbon atoms, 1 to 16 carbon atoms, 1 to 12 carbon atoms, 1 to 8 carbon atoms or 1 to 4 carbon atoms, unless otherwise specified. The alkylene group may be a linear, branched or cyclic alkylene group, which may be optionally substituted with one or more substituents.

The term alkenylene group or alkynylene group herein may mean an alkenylene group or alkynylene group having 2 to 20 carbon atoms, 2 to 16 carbon atoms, 2 to 12 carbon atoms, 2 to 8 carbon atoms or 2 to 4 carbon atoms. The alkenylene group or alkynylene group may be linear, branched or cyclic, which may be optionally substituted with one or more substituents.

The term aryl group or arylene group herein may mean, unless otherwise specified, a monovalent residue or divalent residue derived from a compound comprising one benzene structure, or a structure in which two or more benzene rings are linked while sharing one or two carbon atoms, or linked by any linker, or a derivative thereof. The aryl group or arylene group may be, for example, an aryl group or arylene group having 6 to 30 carbon atoms, 6 to 25 carbon atoms, 6 to 21 carbon atoms, 6 to 18 carbon atoms or 6 to 13 carbon atoms, unless otherwise specified.

In the present application, the term aromatic structure may mean the aryl group or arylene group.

In this specification, the term alicyclic ring structure means a cyclic hydrocarbon structure other than an aromatic ring structure, unless otherwise specified. The alicyclic ring structure may be, for example, an alicyclic ring structure having 3 to 30 carbon atoms, 3 to 25 carbon atoms, 3 to 21 carbon atoms, 3 to 18 carbon atoms or 3 to 13 carbon atoms, unless otherwise specified.

In the present application, the term single bond may mean a case where no separate atom is present at the relevant site. For example, in the structure represented by A-B-C, when B is a single bond, no separate atom exists at the site represented by B, and A and C are directly connected, so that it may mean to form a structure represented by A-C.

In the present application, the substituent, with which the alkyl group, alkenyl group, alkynyl group, alkylene group, alkenylene group, alkynylene group, alkoxy group, aryl group, arylene group, chain or aromatic structure, and the like may be optionally substituted, may be exemplified by a hydroxy group, a halogen atom, a carboxyl group, a glycidyl group, an acryloyl group, a methacryloyl group, an acryloyloxy group, a methacryloyloxy group, a thiol group, an alkyl group, an alkenyl group, an alkynyl group, an alkylene group, an alkenylene group, an alkynylene group, an alkoxy group or an aryl group, and the like, but is not limited thereto.

In one aspect of the present application, the block copolymer comprises a polymer segment (hereinafter, may be referred to as polymer segment A) containing a unit represented by Formula 1 below. The polymer segment A may comprise a unit of Formula 1 as a main component. In this specification, the fact that any polymer segment comprises a certain unit as a main component means a case where the polymer segment comprises the unit 60% or more, 65% or more, 70% or more, 75% or more, 80% or more, 85% or more, or 90% or more and comprises it 100% or less.

[Formula 1]

In Formula 1, R is hydrogen or an alkyl group, X is a single bond, an oxygen atom, a sulfur atom, $-S(=O)_2-$, a carbonyl group, an alkylene group, an alkenylene group, an alkynylene group, $-C(=O)-X_1-$ or $-X_1-C(=O)-$, where $X_1$ is an oxygen atom, $-SiH_2-$, a sulfur atom, —S(=O)₂—, an alkylene group, an alkenylene group or an alkynylene group, and Y is a monovalent substituent comprising a ring structure to which a chain having 8 or more chain-forming atoms is linked.

Here, the chain is substituted with a hydrocarbon functional group containing one or more silicon atoms or iron atoms. The functional group may be substituted in the chain by at least one, for example, one. The functional group may be substituted at an appropriate position of the chain, and for example, may be substituted at the end of the chain.

In another example, X in Formula 1 may be a single bond, an oxygen atom, a carbonyl group, —C(=O)—O— or —O—C(=O)—, or may be —C(=O)—O—, but is not limited thereto.

In Formula 1, the monovalent substituent of Y comprises a chain structure formed by at least eight chain-forming atoms.

In the present application, the term chain-forming atom means an atom forming a straight chain structure of a predetermined chain. The chain may be linear or branched, but the number of chain-forming atoms is calculated by only the number of atoms forming the longest straight chain, where other atoms bonded to the chain-forming atoms (for example, when the chain-forming atom is a carbon atom, hydrogen atoms bonding to the carbon atom, etc.) are not calculated. In addition, when the above-mentioned hydrocarbon functional group is substituted in the above chain, carbon atoms, hydrogen atoms, silicon atoms and/or iron atoms contained in the hydrocarbon functional group are not calculated. Furthermore, in the case of a branched chain, the number of chain-forming atoms can be calculated as the number of chain-forming atoms forming the longest chain. For example, when the chain is an n-pentyl group, all of the chain-forming atoms are carbon atoms and the number thereof is 5, and even when the chain is a 2-methylpentyl group, all of the chain-forming atoms are carbon atoms and the number thereof is 5. The chain-forming atom may be exemplified by carbon, oxygen, sulfur or nitrogen, and the like, and the appropriate chain-forming atom may be carbon, oxygen or nitrogen, or may be carbon or oxygen. The number of chain-forming atoms may be 8 or more, 9 or more, 10 or more, 11 or more, or 12 or more. The number of the chain-forming atoms may be 30 or less, 25 or less, 20 or less, or 16 or less.

When the compound of Formula 1 has formed a block copolymer to be described below, it can cause the block copolymer to exhibit excellent self-assembly properties due to the presence of the chain. Also, due to the functional group containing iron or silicon substituted in the chain, the block copolymer can exhibit excellent etching selectivity after formation of the self-assembled structure.

In one example, the chain may be a linear hydrocarbon chain such as a linear alkyl group. In this case, the alkyl group may be an alkyl group having 8 or more carbon atoms, 8 to 30 carbon atoms, 8 to 25 carbon atoms, 8 to 20 carbon atoms, or 8 to 16 carbon atoms. One or more of carbon atoms of the alkyl group may optionally be substituted with an oxygen atom, and at least one hydrogen atom of the alkyl group may be optionally substituted by another substituent.

In Formula 1, Y comprises a ring structure, where the chain may be linked to the ring structure. By such a ring structure, the self-assembly property of the block copolymer formed by the monomer and the like can be further improved. The ring structure may be an aromatic structure or an alicyclic structure.

The chain may be directly connected to the ring structure or may be connected via a linker. The linker may be exemplified by an oxygen atom, a sulfur atom, —NR₁—, —S(=O)₂—, a carbonyl group, an alkylene group, an alkenylene group, an alkynylene group, —C(=O)—X₁— or —X₁—C(=O)—, where R₁ may be hydrogen, an alkyl group, an alkenyl group, an alkynyl group, an alkoxy group or an aryl group and X₁ may be a single bond, an oxygen atom, a sulfur atom, —NR₂—, —S(=O)₂—, an alkylene group, an alkenylene group or an alkynylene group, and where R₂ may be hydrogen, an alkyl group, an alkenyl group, an alkynyl group, an alkoxy group or an aryl group. The suitable linker may be exemplified by an oxygen atom or a nitrogen atom. The chain may be connected to a ring structure such as an aromatic structure, for example, via an oxygen atom or a nitrogen atom. In this case, the linker may be an oxygen atom, or may be —NR₁— (where R₁ may be hydrogen, an alkyl group, an alkenyl group, an alkynyl group, an alkoxy group or an aryl group).

In one example, Y in Formula 1 may be represented by Formula 2 below.

—P-Q-Z [Formula 2]

In Formula 2, P is an arylene group, Q is a single bond, an oxygen atom or —NR₃—, where R₃ is hydrogen, an alkyl group, an alkenyl group, an alkynyl group, an alkoxy group or an aryl group, and Z is the chain having 8 or more chain-forming atoms. The chain is substituted with a hydrocarbon functional group containing one or more silicon atoms or iron atoms. When Y in Formula 1 is a substituent of Formula 2, P in Formula 2 may be directly linked to X in Formula 1.

In Formula 2, a suitable example of P may be exemplified by an arylene group having 6 to 12 carbon atoms, for example, a phenylene group, but is not limited thereto.

In Formula 2, Q may include, as a suitable example, an oxygen atom or —NR₁— (where R₁ is hydrogen, an alkyl group, an alkenyl group, an alkynyl group, an alkoxy group or an aryl group), and the like.

A suitable example of the monomer of Formula 1 may include a compound in which R is hydrogen or an alkyl group, for example, hydrogen or an alkyl group having 1 to 4 carbon atoms, X is —C(=O)—O—, and Y is a group where in Formula 2, P is an arylene group having 6 to 12 carbon atoms or phenylene, Q is an oxygen atom and Z is the aforementioned chain having 8 or more chain-forming atoms.

Accordingly, an example of the unit of Formula 1 may include a unit of Formula 3 below.

[Formula 3]

In Formula 3, R is hydrogen or an alkyl group having 1 to 4 carbon atoms, X is —C(=O)—O—, P is an arylene group having 6 to 12 carbon atoms, Q is an oxygen atom, Z is the chain having 8 or more chain-forming atoms. The chain is substituted with a hydrocarbon functional group containing one or more silicon atoms or iron atoms.

In the block copolymer of the present application, a hydrocarbon functional group comprising a silicon atom or an iron atom is substituted on the chain in the above structure. This functional group contains at least one or more silicon atoms or iron atoms, and the rest is composed of carbon and hydrogen.

The number of silicon atoms or iron atoms in the functional group may be at least one or more. The upper limit of the number of silicon or iron atoms is not particularly limited, but may be, for example, 6 or less.

The hydrocarbon functional group may be, for example, a functional group represented by Formula 4 below, or may be a silsesquioxanyl group.

[Formula 4]

In Formula 4, each of R is independently a hydrogen atom or an alkyl group, L is a single bond or an oxygen atom, and n is a number in a range of 0 to 10.

In one example, R in Formula above may be a linear or branched alkyl group having 1 to 4 carbon atoms.

In Formula above, when R is an alkyl group, the number of carbon atoms of each alkyl group may be the same or different.

A specific example of the hydrocarbon functional group of Formula 4 may be exemplified by a trialkylsiloxy group, a butyldimethylsilane group, a trimethylsilane group, a dimethylsilylmethyltrimethylsilane group or a trimethylsilyltrisilane group, and the like. As the hydrocarbon functional group, a silsesquioxanyl group and the like may also be used.

The block copolymer comprises, together with the polymer segment A, a polymer segment B different from the polymer segment.

In the present application, the fact that two kinds of polymer segments are identical means any one case of cases in which in any two kinds of polymer segments the kinds of monomer units contained as the main component are identical to each other, or 50% or more, 55% or more, 60% or more, 65% or more, 70% or more, 75% or more, 80% or more, 85% or more or 90% or more of monomer unit kinds contained in two kinds of polymer segments are common and a weight ratio deviation of the common monomer units in each polymer segment is within 30%, within 25%, within 20%, within 20%, within 15%, within 10% or within 5%. If both polymer segments do not satisfy the two cases, they are polymer segments that are different from each other. Here, it may be proper that the ratio of the common monomer units is satisfied for both polymer segments. For example, if any polymer segment 1 has monomer units of A, B, C, D and F and the other polymer segment 2 has monomer units of D, F, G and H, then the common monomer units in polymer segments 1 and 2 are D and F, where in the position of polymer segment 1 the common ratio is 40% (=100×2/5) because two kinds of the total five kinds are common, but in the position of polymer segment 2 the ratio is 50% (=100× 2/4). Thus, in this case, both polymer segments may be regarded as not identical because the common ratio is not less than 50% only in polymer segment 2. On the other hand, the weight ratio deviation of the common monomers is a percentage of a numerical value in which a large weight ratio minus a small weight ratio is divided by the small weight ratio. For example, in the above case, if the weight ratio of the D monomer units in the segment 1 is about 40% based on 100% of the total weight ratio of the whole monomer units in the segment 1 and the weight ratio of the D monomer units in the segment 2 is about 30% based on 100% of the total weight ratio of the whole monomer units in the segment 2, the weight ratio deviation may be about 33% (=100×(40− 30)/30) or so. If the common monomer units are two or more kinds in two segments, in order to be the same segment, it can be considered as the common monomers when the weight ratio deviation within 30% is satisfied for all the common monomers or for the monomer unit as the main component. Each polymer segment that is recognized as the same by the above criteria may be a different type of polymer (e.g., any one segment is in the form of a block copolymer and the other segment is in the form of a random copolymer), but it may be, suitably, the same type of polymer.

The block copolymer of the present application may be a diblock type in which the polymer segment B is connected to the end of the polymer segment A as above, or may be a multi-block copolymer of two blocks or more.

In one example, the polymer segment B may be a polymer segment having an aromatic structure containing one or more halogen atoms.

Such a polymer segment B may be, for example, a polymer segment comprising a unit represented by Formula 5 below. The polymer segment may comprise a unit represented by Formula 7 below as a main component.

[Formula 5]

In Formula 5, B is a monovalent substituent having an aromatic structure containing one or more halogen atoms.

When the polymer segment B is present on at least one side of the above-mentioned polymer segment A, the block copolymer can exhibit excellent self-assembly properties and the like.

In Formula 5, the aromatic structure may be, for example, an aromatic structure having 6 to 18 carbon atoms or 6 to 12 carbon atoms.

Also, the halogen atom contained in Formula 5 may be exemplified by a fluorine atom or a chlorine atom, and the like, and suitably, a fluorine atom can be used, but is not limited thereto.

In one example, B in Formula 5 may be a monovalent substituent having an aromatic structure of 6 to 12 carbon atoms substituted with 1 or more, 2 or more, 3 or more, 4 or more, or 5 or more halogen atoms. Here, the upper limit of the number of halogen atoms is not particularly limited and may be, for example, 10 or less, 9 or less, 8 or less, 7 or less, or 6 or less.

For example, Formula 5, which is the unit contained in the polymer segment B may be represented by Formula 6 below.

[Formula 6]

In Formula 6, $X_2$ is a single bond, an oxygen atom, a sulfur atom, —S(=O)$_2$—, an alkylene group, an alkenylene group, an alkynylene group, —C(=O)—$X_1$— or —$X_1$—C(=O)—, where $X_1$ is a single bond, an oxygen atom, a sulfur atom, —S(=O)$_2$—, an alkylene group, an alkenylene group or an alkynylene group, and W is an aryl group containing at least one halogen atom. Here, W may be an aryl group substituted with at least one halogen atom, for example, an aryl group having 6 to 12 carbon atoms substituted with 2 or more, 3 or more, 4 or more, or 5 or more halogen atoms.

The unit contained in the polymer segment B may be represented by, for example, Formula 7 below.

[Formula 7]

In Formula 7, $X_2$ is a single bond, an oxygen atom, a sulfur atom, —S(=O)$_2$—, an alkylene group, an alkenylene group, an alkynylene group, —C(=O)—$X_1$— or —$X_1$—C(=O)—, where $X_1$ is a single bond, an oxygen atom, a sulfur atom, —S(=O)$_2$—, an alkylene group, an alkenylene group or an alkynylene group, and $R_1$ to $R_5$ are each independently hydrogen, an alkyl group, a haloalkyl group or a halogen atom, where the number of halogen atoms contained in $R_1$ to $R_5$ is 1 or more.

In another example, $X_2$ in Formula 7 may be a single bond, an oxygen atom, an alkylene group, —C(=O)—O— or —O—C(=O)—.

In Formula 7, $R_1$ to $R_5$ are each independently hydrogen, an alkyl group, a haloalkyl group or a halogen atom, provided that $R_1$ to $R_5$ may comprise 1 or more, 2 or more, 3 or more, 4 or more, or 5 or more halogen atoms, for example, fluorine atoms. The halogen atom, for example, fluorine atom, contained in $R_1$ to $R_5$ may be 10 or less, 9 or less, 8 or less, 7 or less, or 6 or less.

The block copolymer of the present application as above can exhibit excellent phase separation or self-assembly properties basically.

In the block copolymer as above, the volume fraction of the polymer segment A may be in a range of 0.1 to 0.9, and the sum of the volume fractions of the polymer segments A and B may be 1. The block copolymer comprising each polymer segment at the above volume fractions may exhibit excellent self-assembly properties. The volume fraction of each polymer segment in the block copolymer can be determined based on the density and the molecular weight measured by GPC (gel permeation chromatography), of each polymer segment.

The block copolymer may have a number average molecular weight (Mn) in a range of, for example, 3,000 to 300,000. In this specification, the term number average molecular weight is a converted value for standard polystyrene measured using GPC (gel permeation chromatograph), and the term molecular weight herein means a number average molecular weight, unless otherwise specified. In another example, the molecular weight (Mn) may be, for example, 3000 or more, 5000 or more, 7000 or more, 9000 or more, 11000 or more, 13000 or more, or 15000 or more. In another example, the molecular weight (Mn) may be 250000 or less, 200000 or less, 180000 or less, 160000 or less, 140000 or less, 120000 or less, 100000 or less, 90000 or less, 80000 or less, 70000 or less, 60,000 or less, 50000 or less, 40000 or less, 30000 or less, or 25000 or less. The block copolymer may have a polydispersity (Mw/Mn) in a range of 1.01 to 1.60. In another example, the polydispersity may be about 1.1 or more, about 1.2 or more, about 1.3 or more, or about 1.4 or more.

In this range, the block copolymer may exhibit proper self-assembly properties. The number average molecular weight of the block copolymer or the like can be adjusted in consideration of the desired self-assembled structure and the like.

When the block copolymer comprises at least the polymer segment A, B and C, the ratio of the polymer segment A, for example, the polymer segment comprising the chain described above, in the block copolymer may be in a range of 10 mol % to 90 mol %.

Such a block copolymer can be prepared in a known manner. For example, the block copolymer can be produced by a LRP (living radical polymerization) method using monomers forming a unit of each polymer segment. For example, there are anionic polymerization in which the block copolymer is synthesized in the presence of an inorganic acid salt such as an alkali metal or an alkali earth metal by using an organic rare earth metal complex as a polymerization initiator or by using an organic alkali metal compound as a polymerization initiator, an anionic polymerization method in which the block copolymer is synthesized in the presence of an organic aluminum compound by using an organic alkali metal compound as a polymerization initiator, an atom transfer radical polymerization method (ATRP) using an atom transfer radical polymerization agent as a polymerization initiator, an ARGET (Activators Regenerated by Electron Transfer) atom transfer radical polymerization method (ATRP), which uses an atom transfer radical polymerization agent as a polymerization initiator, but performs polymerization under an organic or inorganic reducing agent that generates electrons, an ICAR (Initiators for Continuous Activator Regeneration) atom transfer radical polymerization method (ATRP), a polymerization method by reversible addition-fragmentation chain transfer (RAFT) using an inorganic reducing agent and a reversible addition-fragmentation chain transfer agent or a method of using an organotellurium compound as an initiator, and the like, and a suitable method may be selected among these methods and applied.

For example, the block copolymer can be prepared in a manner comprising polymerizing a reactant comprising monomers capable of forming the polymer segments in the presence of a radical initiator and a living radical polymerization reagent by a living radical polymerization method.

Upon preparing the block copolymer, the method of forming the other polymer segment included together with the polymer segment formed by using the monomer in the copolymer is not particularly limited, and the other polymer segments may be formed by selecting an appropriate monomer in consideration of the kind of the desired polymer segment.

The process of producing the polymer segment copolymer may further comprise, for example, a process of precipitating the polymerization product produced through the above processes in a non-solvent.

The kind of the radical initiator is not particularly limited, which may be appropriately selected in consideration of polymerization efficiency, and for example, an azo compound such as AIBN (azobisisobutyronitrile) or 2,2'-azobis-(2,4-dimethylvaleronitrile), or peroxide series such as BPO (benzoyl peroxide) or DTBP (di-t-butyl peroxide) may be used.

The living radical polymerization process may be performed in a solvent such as, for example, methylene chloride, 1,2-dichloroethane, chlorobenzene, dichlorobenzene, benzene, toluene, acetone, chloroform, tetrahydrofuran, dioxane, monoglyme, diglyme, dimethylformamide, dimethyl sulfoxide or dimethylacetamide.

As the non-solvent, an alcohol such as methanol, ethanol, normal propanol or isopropanol, a glycol such as ethylene glycol, n-hexane, cyclohexane, n-heptane or ether series such as petroleum ether can be used, without being limited thereto.

The present application also relates to a polymer film comprising the block copolymer. The polymer film may be used for various applications, and for example, may be used for various electric or electronic elements, a process of forming the pattern, a recording medium such as a magnetic storage medium and a flash memory, or a biosensor, and the like.

In one example, the block copolymer in the polymer film may implement a periodic structure including a sphere, a cylinder, a gyroid, a lamella, or the like through self-assembly.

For example, in the block copolymer, the polymer segments A to C or another segment in the other segments covalently bonded thereto may form a regular structure such as a lamellar shape or a cylinder shape.

The present application also relates to a method for forming a polymer film using the block copolymer. The method may comprise forming a polymer film comprising the block copolymer in a self-assembled state on a substrate. For example, the method may comprise a process of forming a layer of the block copolymer or a coating liquid in which the block copolymer is diluted in an appropriate solvent on the substrate by application or the like, and, if necessary, annealing or heat-treating the layer.

The annealing or heat treatment may be performed based on, for example, the phase transition temperature or the glass transition temperature of the block copolymer, and may be performed at, for example, a temperature above the glass transition temperature or the phase transition temperature. The time for which this heat treatment is performed is not particularly limited, and the treatment can be performed within a range of, for example, about 1 minute to 72 hours, but the time can be changed as needed. The heat treatment temperature of the polymer thin film may be, for example, about 100° C. to 250° C., but this may be changed in consideration of the block copolymer to be used.

In another example, the formed layer may also be subjected to solvent annealing in a non-polar solvent and/or a polar solvent at room temperature for about 1 minute to 72 hours.

The present application also relates to a patterning method. For example, the method may comprise a process of selectively removing the polymer segments A and/or B of the block copolymer from a laminate having a substrate, and the polymer film formed on the surface of the substrate and comprising the self-assembled block copolymer. The method may be a method of forming a pattern on the substrate. For example, the method may comprise forming a polymer film comprising the block copolymer on a substrate, selectively removing any one or more polymer segments of the block copolymer present in the film, and then etching the substrate. In this way, it is possible to form, for example, a nanoscale fine pattern. In addition, various types of patterns such as nano-rods or nano-holes can be formed through the above-described method depending on the shape of the block copolymer in the polymer film. If necessary, the block copolymer may be mixed with other compolymer or a homopolymer for pattern formation. The type of the substrate to be applied to this method is not particularly limited and may be selected as needed, and for example, silicon oxide or the like may be applied.

For example, the method can form a nanoscale pattern of silicon oxide exhibiting a high aspect ratio. For example, after forming the polymer film on silicon oxide and selectively removing any one polymer segment of the block copolymer in a state where the block copolymer in the polymer film forms a predetermined structure, the silicon oxide may be etched by various ways, for example, reactive ion etching or the like to realize various shapes including patterns of nano-rods or nano-holes, and the like. In addition, a nanopattern having a large aspect ratio can be realized through such a method.

For example, the pattern can be implemented on a scale of several tens of nanometers, and such a pattern can be utilized for various applications including, for example, next-generation information electronic magnetic recording media and the like.

The method of selectively removing any one polymer segment of the block copolymer in the above method is not particularly limited, and for example, a method of removing a relatively soft polymer segment by irradiating the polymer film with an appropriate electromagnetic wave, for example, ultraviolet or the like, can be used. In this case, the ultraviolet irradiation condition is determined according to the type of the polymer segment of the block copolymer, and the method can be performed, for example, by being irradiated with ultraviolet having a wavelength of about 254 nm for 1 minute to 60 minutes.

In addition, following the ultraviolet irradiation, a step of treating the polymer film with an acid or the like to further remove the segment decomposed by ultraviolet may also be performed.

Furthermore, the step of etching the substrate using the polymer film in which the polymer segments are selectively removed as a mask is not particularly limited, which may be performed, for example, through a reactive ion etching step using $CF_4$/Ar ions or the like and following this process, a step of removing the polymer film from the substrate by an oxygen plasma treatment or the like may also be performed.

Advantageous Effects

The present application can provide a block copolymer and a use thereof. The block copolymer of the present application can have excellent self-assembly properties or phase separation characteristics and excellent etching selectivity, and various other functions as required can be freely imparted thereto.

MODE FOR INVENTION

Hereinafter, the present application will be described in detail by way of examples according to the present application and comparative examples, but the scope of the present application is not limited by the following examples.

1. NMR Measurement

NMR analyses were performed at room temperature using an NMR spectrometer including a Varian Unity Inova (500 MHz) spectrometer with a triple resonance 5 mm probe. The analytes were diluted in a solvent for NMR measurement ($CDCl_3$) to a concentration of about 10 mg/ml, and chemical shifts were expressed in ppm.

<Application Abbreviation> br=broad signal, s=singlet, d=doublet, dd=double doublet, t=triplet, dt=double triplet, q=quartet, p=quintet, m=multiplet.

2. GPC (Gel Permeation Chromatograph)

The number average molecular weight (Mn) and the molecular weight distribution were measured using GPC (gel permeation chromatography). Into a 5 mL vial, an analyte such as block copolymers of Examples or Comparative Examples or a giant initiator is put and diluted in THF (tetrahydrofuran) to be a concentration of about 1 mg/mL or so. Then, a standard sample for calibration and a sample to be analyzed were filtered through a syringe filter (pore size: 0.45 μm) and then measured. As the analytical program, ChemStation from Agilent Technologies was used, and the elution time of the sample was compared with the calibration curve to obtain the weight average molecular weight (Mw) and the number average molecular weight (Mn), respectively, and the molecular weight distribution (PDI) was calculated by the ratio (Mw/Mn) thereof. The measurement conditions of GPC are as follows.

<GPC Measurement Condition>

Instrument: 1200 series from Agilent Technologies

Column: using two PLgel mixed B from Polymer Laboratories

Solvent: THF

Column temperature: 35° C.

Sample concentration: 1 mg/mL, 200 μL injection

Standard samples: polystyrene (Mp: 3900000, 723000, 316500, 52200, 31400, 7200, 3940, 485)

Preparation Example 1

A compound of Formula A below (UPMTBS) was synthesized in the following manner. 11-bromo-1-undecanol (25.1 g, 100 mmol), 3,4-dihydro-2H-pyran (16.8 g, 200 mmol), 1,4-dioxane (200 mL) and hydrogen chloride (4N in 1,4-dioxane, 80 drops) were reacted in a flask to obtain 2-((11-bromoundecyl)oxy)tetrahydro-2H-pyran (33.3 g, 99.3 mmol, yield 99%). The 2-((11-bromoundecyl)oxy) tetrahydro-2H-pyran (33.3 g, 99.3 mmol) and hydroquinone (21.9 g, 198.6 mmol) were added to a flask and dissolved in DMSO (dimethyl sulfoxide) (300 mL), and then potassium carbonate (27.4 g, 198.6 mmol) was added thereto, reacted overnight at 70° C., and then an excess of water was added, extracted with MC (methylene chloride), and washed with water. After removing the water from the MC solution with anhydrous magnesium sulfate and removing the solvent, the solution was subjected to column with an EA (ethyl acetate)/hexane solution (1:4=EA:hexane) to obtain 4-((11-((tetra-hydro-2H-pyran-2-yl)oxy)undecyl)oxy)phenol (20.0 g, 54.9 mmol, yield 55%).

4-((11-((tetrahydro-2H-pyran-2-yl)oxy)undecyl)oxy) phenol (20.0 g, 54.9 mmol), methacrylic acid (6.1 g, 71.4 mmol), MC (methylene chloride) (500 mL), DCC (N,N'-dicyclohexylcarbodiimide) (14.7 g, 71.4 mmol) and DMAP (4-dimethylaminopyridine) (2.7 g, 22.0 mmol) were used to obtain 4-((11-((tetrahydro-2H-pyran-2-yl)oxy)undecyl)oxy) phenyl methacrylate (UPMTHP) (16.7 g, 38.6 mmol, yield 70%). The UPMTHP (16.7 g, 38.6 mmol), methanol (200 mL) and hydrogen chloride (4N in 1,4-dioxane, 80 drops) were used to obtain 4-((11-hydroxyundecyl)oxy)phenyl methacryate (HUPM, 8.6 g, 24.7 mmol, yield 64%).

The HUPM (8.6 g, 24.7 mmol) and imidazole (4.2 g, 61.7 mmol) were placed in a flask, dissolved in DMF (dimethylformamide) (60 mL), and then immersed in an ice bath. TBDMSCI (tert-butyldimethylsilyl chloride) (4.5 g, 29.6 mmol) was dissolved in DMF and added to the reaction solution little by little. The flask was taken out at room temperature, and the reaction solution was reacted overnight, extracted with water and MC, and then the organic layer was collected and subjected to column with an EA/hexane solution (1:1). A colorless liquid target product (UPMTBS, Formula A below) (11.4 g, 24.6 mmol) was obtained.

<NMR Analysis Result of UPMTBS>

$^1$H-NMR ($CDCl_3$): d7.01 (d, 2H); d6.88 (d, 2H); d6.32 (s, 2H); d5.73 (s, 1H); d3.94 (t, 2H); d3.60 (t, 2H): d2.05 (s, 3H): d1.77 (m, 2H): d1.51 (m, 2H): d1.45 (m, 2H): d1.29 (m, 12H): d0.90 (s, 9H): d0.05 (s, 6H)

[Formula A]

In Formula A, R is an 11-tert-butyldimethylsilylundecyl group.

Preparation Example 2

A compound of Formula B below (UPMDS) was synthesized in the following manner. Magnesium turnings (4.4 g, 180 mmol) were placed in a flask, and anhydrous THF (tetrahydrofuran) (120 mL) was added, and then 1,2-dibromoethane (2 drops) and iodine (few crystals) were placed therein. After stirring at room temperature for about 10 minutes, a chloromethyltrimethylsilane (20 g, 164 mmol)/anhydrous THF (40 mL) solution was added dropwise while refluxing at 80° C. After the vigorous reaction was completed, the reaction solution was cooled to room temperature and then dimethylchlorosilane (16.9 g, 20 mL, 180 mmol) was gradually added thereto. The reaction solution was heated to 80° C. and refluxed overnight. After the reaction, the reactant was extracted with a mixed solution of water/hexane, and the organic layer was collected to remove the solvent. ((Trimethylsilyl) methyl)dimethylsilane (13.0 g, 88.8 mmol, yield 54%) was obtained as a colorless liquid.

<NMR Analysis Result>

$^1$H-NMR ($CDCl_3$): d3.97 (m, 1H); d0.09 (d, 6H); d0.03 (s, 9H), d−0.23 (d, 2H)

4-(undec-10-en-1-yloxy)phenol (9.0 g, 34.3 mmol) and ((trimethylsilyl)methyl)dimethylsilane (10.0 g, 68.6 mmol) were placed in a flask and dissolved in anhydrous toluene (60 mL). Karstedt's catalyst (in xylene, ~2% Pt, 6.9 mL, 0.69 mmol) was added while stirring at room temperature and reacted for 3 days. Then, the solvent was removed and the residue was subjected to column separation with an EA/hexane solution (1:5=EA:hexane) to obtain 4-((11-(dimethyl((trimethylsilyl)methyl)silyl)undecyl)oxy)phenol (7.2 g, 17.6 mmol, yield 51%) as a colorless liquid.

<NMR Analysis Result>

$^1$H-NMR (CDCl$_3$): d6.76 (m, 4H); d4.41 (s, 1H); d 3.89 (t, 2H); d 1.75 (tt, 2H); d 1.44 (tt, 2H); d 1.25 (m, 14H); d 0.47 (m, 2H); d 0.02 (s, 9H); d −0.01 (s, 6H); d −0.30 (s, 2H)

4-((11-(dimethyl(trimethylsilyl)methyl)silyl)undecyl)oxy)phenol (7.2 g, 17.6 mmol) and methacrylic acid (1.7 g, 19.4 mmol) were placed in a flask, and stirred and dissolved in MC (methylene chloride) (200 mL). DCC (N,N'-dicyclohexylcarbodiimide) (4.0 g, 19.4 mmol) and DMAP (4-dimethylaminopyridine) (0.86 g, 7.0 mmol) were added to the reaction solution and reacted overnight at room temperature. Thereafter, the solvent was removed, and the product was subjected to column with an EA/hexane solution (EA: hexane=1:4) to obtain a target product (Formula B, UPMDS) (7.8 g, 16.4 mmol) as a viscous colorless liquid.

<NMR Analysis Result of UPMDS>

$^1$H-NMR (CDCl$_3$): d7.01 (d, 2H); d6.88 (d, 2H); d6.32 (s, 1H); d5.73 (s, 1H); d3.94 (t, 2H); d3.60 (t, 2H): d2.05 (s, 3H): d1.77 (tt, 2H): d1.46 (tt, 2H): d1.27 (m, 14H): d0.48 (m, 2H): d0.02 (s, 9H): d−0.01 (s, 6H); d−0.30 (d, 2H)

[Formula B]

In Formula B, R is an 11-(dimethyl((trimethylsilyl)methyl)silyl)undecyl group.

Preparation Example 3

A compound of Formula C below (UPMDTMSS) was synthesized in the following manner. Magnesium turnings (4.4 g, 180 mmol) were placed in a flask, and anhydrous THF (tetrahydrofuran) (120 mL) was added and then 1,2-dibromoethane (2 drops) and iodine (few crystals) were placed therein. After stirring at room temperature for about 10 minutes, a chloromethyltrimethylsilane (20 g, 164 mmol)/anhydrous THF (40 mL) solution was added dropwise while refluxing at 80° C. After the vigorous reaction was completed, the reaction solution was cooled to room temperature and dichloromethylsilane (7.5 g, 6.8 mL, 65 mmol) was gradually added thereto. The reaction solution was heated to 80° C. and refluxed overnight. After the reaction, the reactant was extracted with a mixed solution of water/hexane, and the organic layer was collected to remove the solvent. 2,2,4,6,6-pentamethyl-2,4,6-trisilaheptane (14.6 g, 66.8 mmol, yield 100%) was obtained as a colorless liquid.

<NMR Analysis Result>

$^1$H-NMR (CDCl$_3$): d3.99 (m, 1H); d0.08 (d, 3H); d0.01 (s, 18H), d−0.24 (d, 2H); d−0.26 (d, 2H)

4-(undec-10-en-1-yloxy)phenol (6.0 g, 22.9 mmol) and 2,2,4,6,6-pentamethyl-2,4,6-trisilaheptane (10.0 g, 45.8 mmol) were added to a flask and dissolved in anhydrous toluene (60 mL). Karstedt's catalyst (in xylene, ~2% Pt, 4.6 mL, 0.46 mmol) was added at room temperature and reacted for 4 days. Then, the solvent was removed and the residue was subjected to column separation with an EA/hexane solution (1:4=EA:hexane) to obtain 4-((11-(methylbis((trimethylsilyl)methyl) silyl)undecyl)oxy)phenol (3.1 g, 6.5 mmol, yield 28%) as a colorless liquid.

<NMR Analysis Result>

$^1$H-NMR (CDCl$_3$): d6.76 (m, 4H); d4.36 (s, 1H); d 3.89 (t, 2H); d 1.75 (tt, 2H); d 1.44 (tt, 2H); d 1.27 (m, 14H); d 0.49 (m, 2H); d 0.03 (s, 3H); d 0.01 (s, 18H); d −0.27 (d, 2H); d −0.28 (s, 2H)

4-((11-(methylbis((trimethylsilyl)methyl) silyl)undecyl) oxy)phenol (3.1 g, 6.5 mmol) and methacrylic acid (0.61 g, 7.1 mmol) were placed in a flask, and stirred and dissolved in MC (methylene chloride) (200 mL). DCC (N,N'-dicyclohexylcarbodiimide) (1.46 g, 7.1 mmol) and DMAP (4-dimethylaminopyridine) (0.32 g, 2.6 mmol) were added to the reaction solution and reacted at room temperature for 2 days. Thereafter, the solvent was removed, and the product was subjected to column with an EA/hexane solution (EA: hexane=1:4) to obtain a target product (C, UPMDTMSS) (3.2 g, 5.7 mmol, yield 89%) as a viscous colorless liquid.

<NMR Analysis Result of UPMDTMSS>

$^1$H-NMR (CDCl$_3$): d7.01 (d, 2H); d6.88 (d, 2H); d6.32 (s, 1H); d5.73 (s, 1H); d3.94 (t, 2H); d2.05 (s, 3H); d 1.76 (tt, 2H): d 1.45 (tt, 2H); d 1.27 (m, 14H), d 0.48 (m, 2H), d 0.03 (s, 3H), d 0.01 (s, 18H), d −0.27 (d, 2H), d −0.28 (s, 2H)

[Formula C]

In Formula C, R is an 11-(methylbis((trimethylsilyl) methyl)silyl)undecyl group.

Preparation Example 4

A compound of Formula D below (UPMTTMSS) was synthesized in the following manner. Hydroquinone (38.3 g, 348 mmol), 11-bromo-1-undecene (27.1 g, 116 mmol) and potassium carbonate (48.1 g, 348 mmol) were placed in a flask and dissolved in DMF (dimehylformamide) (200 mL). The solution was reacted overnight at 80° C., and then precipitated in an excess of water and acidified with acetic acid. The precipitate was filtered and subjected to column with an EA/hexane solution (1:4=EA:hexane) to obtain 4-(undec-10-en-lyloxy)phenol (16.2 g, 61.7 mmol, yield 53%) as a white solid.

<NMR Analysis Result>

$^1$H-NMR (CDCl$_3$): δ 6.76 (m, 4H); d 5.81 (m, 1H); d 4.99 (d, 1H); d 4.93 (d, 1H); d 4.35 (s, 1H); d 3.89 (t, 2H); d 2.04 (dt, 2H), d 1.75 (tt, 2H); d 1.44 (tt, 2H); d 1.29 (m, 10H)

4-(undec-10-en-1-yloxy)phenol (6.0 g, 22.9 mmol), tris (trimethylsilyl)silane (6.8 g, 27.4 mmol) and AIBN (azobisisobutyronitrile) (1.5 g, 9.2 mmol) were placed in a flask and dissolved in anhydrous toluene (150 mL). After reacting the reaction flask at 90° C. for 4 hours, the solvent was removed, and the residue was subjected to column with an EA/hexane solution (EA:hexane 1:4). 4-((11-(tris(trimethylsilyl)silyl)undecyl)oxy)phenol (4.8 g, 9.5 mmol, yield 41%) was obtained as a viscous colorless liquid.

<NMR Analysis Result>

$^1$H-NMR (CDCl$_3$): d6.76 (m, 4H); d4.37 (s, 1H); d 3.89 (t, 2H); d 1.75 (tt, 2H); d 1.44 (tt, 2H); d 1.28 (m, 14H); d 0.75 (m, 2H); d 0.15 (s, 27H)

4-((11-(tris(trimethylsilyl)silyl)undecyl)oxy)phenol (4.8 g, 9.5 mmol) and methacrylic acid (0.90 g, 10.4 mmol) were placed in a flask, and stirred and dissolved in MC (methylene chloride) (70 mL). DCC (N,N'-dicyclohexylcarbodiimide) (2.2 g, 10.4 mmol) and DMAP (4-dimethylaminopyridine) (0.46 g, 3.8 mmol) were added to the reaction solution and reacted at room temperature for 4 hours. Thereafter, the solvent was removed, and the product was subjected to column with an EA/hexane solution (EA:hexane=1:4) to obtain a target product (Formula D, UPMTTMSS) (4.5 g, 7.8 mmol, yield 82%) as a viscous colorless liquid.

<NMR Analysis Result of UPMDTMSS>
$^1$H-NMR (CDCl$_3$): d7.01 (d, 2H); d6.88 (d, 2H); d6.32 (s, 1H); d5.73 (s, 1H); d3.94 (t, 2H); d2.05 (s, 3H); d 1.77 (tt, 2H): d 1.45 (tt, 2H); d 1.28 (m, 14H), d 0.75 (m, 2H), d 0.15 (s, 27H)

[Formula D]

In Formula D, R is an 11-(tris(trimethylsilyl)silyl)undecyl group.

Example 1

2.0 g of the compound of Preparation Example 1 (UPMTBS), 47.8 mg of CPBD (2-cyano-2-propyl benzodithioate) as an RAFT (reversible addition-fragmentation chain transfer) reagent, 17.7 mg of AIBN (azobisisobutyronitrile) and 4.690 mL of anisole were placed in a 10 mL Schlenk flask and stirred at room temperature for 30 minutes under a nitrogen atmosphere, and then an RAFT (reversible addition-fragmentation chain transfer) polymerization reaction was performed at 70° C. for 4 hours. After the polymerization, the reaction solution was precipitated in 300 mL of methanol as an extraction solvent, and then filtered under reduced pressure and dried to prepare a pink macro initiator. The number average molecular weight (Mn) and the molecular weight distribution (Mw/Mn) of the macro initiator were 10,800 and 1.17, respectively. 0.3 g of the macro initiator, 1.3479 g of a pentafluorostyrene monomer, 2.3 mg of AIBN (azobisisobutyronitrile) and 0.552 mL of anisole were placed in a 50 mL Schlenk flask and stirred at room temperature for 1 hour under a nitrogen atmosphere, and then an RAFT (reversible addition-fragmentation chain transfer) polymerization reaction was performed at 70° C. for 3 hours. After the polymerization, the reaction solution was precipitated in 250 mL of methanol as an extraction solvent twice and then filtered under reduced pressure dried to prepare a pale pink block copolymer. The number average molecular weight (Mn) and the molecular weight distribution (Mw/Mn) of the block copolymer were 18,800 and 1.21, respectively. The block copolymer comprises a polymer segment A derived from the UPMTBS of Preparation Example 1 and a polymer segment B derived from the pentafluorostyrene monomer.

Example 2

1.0 g of the compound of Preparation Example 2 (UPMDS), 46.3 mg of CPBD (2-cyano-2-propyl benzodithioate) as an RAFT (reversible addition-fragmentation chain transfer) reagent, 17.1 mg of AIBN (azobisisobutyronitrile) and 2.341 mL of anisole were placed in a 10 mL Schlenk flask and stirred at room temperature for 1 hour under a nitrogen atmosphere, and then an RAFT (reversible addition-fragmentation chain transfer) polymerization reaction was performed at 70° C. for 4 hours. After the polymerization, the reaction solution was precipitated in 300 mL of methanol as an extraction solvent twice, and then filtered under reduced pressure and dried to prepare a pink macro initiator. The number average molecular weight (Mn) and the molecular weight distribution (Mw/Mn) of the macro initiator were 9,100 and 1.19, respectively. 0.2 g of the macro initiator, 1.0664 g of a pentafluorostyrene monomer, 1.8 mg of AIBN (azobisisobutyronitrile) and 1.272 mL of anisole were placed in a 10 mL Schlenk flask and stirred at room temperature for 1 hour under a nitrogen atmosphere, and then an RAFT (reversible addition-fragmentation chain transfer) polymerization reaction was performed at 70° C. for 3 hours and 30 minutes. After the polymerization, the reaction solution was precipitated in 250 mL of methanol as an extraction solvent twice and then filtered under reduced pressure dried to prepare a pale pink block copolymer. The number average molecular weight (Mn) and the molecular weight distribution (Mw/Mn) of the block copolymer were 18,300 and 1.24, respectively. The block copolymer comprises a polymer segment A derived from the UPMDS of Preparation Example 2 and a polymer segment B derived from the pentafluorostyrene monomer.

Example 3

1.0 g of the compound of Preparation Example 3 (UPMDTMSS), 26.9 mg of CPBD (2-cyano-2-propyl benzodithioate) as an RAFT (reversible addition-fragmentation chain transfer) reagent, 10 mg of AIBN (azobisisobutyronitrile) and 2.345 mL of anisole were placed in a 10 mL Schlenk flask and stirred at room temperature for 1 hour under a nitrogen atmosphere, and then an RAFT (reversible addition-fragmentation chain transfer) polymerization reaction was performed at 70° C. for 4 hours. After the polymerization, the reaction solution was precipitated in 300 mL of methanol as an extraction solvent twice, and then filtered under reduced pressure and dried to prepare a pink macro initiator. The number average molecular weight (Mn) and the molecular weight distribution (Mw/Mn) of the macro initiator were 10,800 and 1.19, respectively. 0.3 g of the macro initiator, 1.3479 g of a pentafluorostyrene monomer, 2.3 mg of AIBN (azobisisobutyronitrile) and 0.552 mL of anisole were placed in a 10 mL Schlenk flask and stirred at room temperature for 1 hour under a nitrogen atmosphere, and then an RAFT (reversible addition-fragmentation chain transfer) polymerization reaction was performed at 70° C. for 3 hours and 30 minutes. After the polymerization, the reaction solution was precipitated in 250 mL of methanol as an extraction solvent twice and then filtered under reduced pressure dried to prepare a pale pink block copolymer. The number average molecular weight (Mn) and the molecular weight distribution (Mw/Mn) of the block copolymer were 20,800 and 1.27, respectively. The block copolymer comprises a polymer segment A derived from the UPMDTMSS of Preparation Example 3 and a polymer segment B derived from the pentafluorostyrene monomer.

Example 4

1.0 g of the compound of Preparation Example 4 (UPMTTMSS), 25.4 mg of CPBD (2-cyano-2-propyl benzodithioate) as an RAFT (reversible addition-fragmentation chain transfer) reagent, 9.4 mg of AIBN (azobisisobutyronitrile) and 2.345 mL of anisole were placed in a 10 mL Schlenk flask and stirred at room temperature for 1 hour under a nitrogen atmosphere, and then an RAFT (reversible addition-fragmentation chain transfer) polymerization reaction was performed at 70° C. for 4 hours. After the polymerization, the reaction solution was precipitated in 300 mL of methanol as an extraction solvent twice, and then filtered under reduced pressure and dried to prepare a pink macro initiator. The number average molecular weight (Mn) and the molecular weight distribution (Mw/Mn) of the macro initiator were 10,300 and 1.16, respectively. 0.3 g of the macro initiator, 1.9786 g of a pentafluorostyrene monomer, 2.4 mg of AIBN (azobisisobutyronitrile) and 0.763 mL of anisole were placed in a 10 mL Schlenk flask and stirred at room temperature for 1 hour under a nitrogen atmosphere, and then an RAFT (reversible addition-fragmentation chain transfer) polymerization reaction was performed at 70° C. for 3 hours. After the polymerization, the reaction solution was precipitated in 250 mL of methanol as an extraction solvent twice and then filtered under reduced pressure dried to prepare a pale pink block copolymer. The number average molecular weight (Mn) and the molecular weight distribution (Mw/Mn) of the block copolymer were 22,900 and 1.23, respectively. The block copolymer comprises a polymer segment A derived from the UPMTTMSS of Preparation Example 4 and a polymer segment B derived from the pentafluorostyrene monomer.

Test Example 1

The self-assembled polymer films were formed using the block copolymers of Examples 1 to 4, and the results were confirmed. Each block copolymer was dissolved in toluene to a concentration of about 1.0 wt % to prepare a coating liquid, and the coating liquid was spin-coated on a silicon wafer at a speed of 3000 rpm for 60 seconds and then a film comprising the self-assembled block copolymer was formed through thermal annealing. FIGS. 1 to 4 are SEM photographs of the polymer films formed in the above manner, which are SEM photographs of the polymer films of Examples 1 to 4, respectively.

Test Example 2

Figure 1:
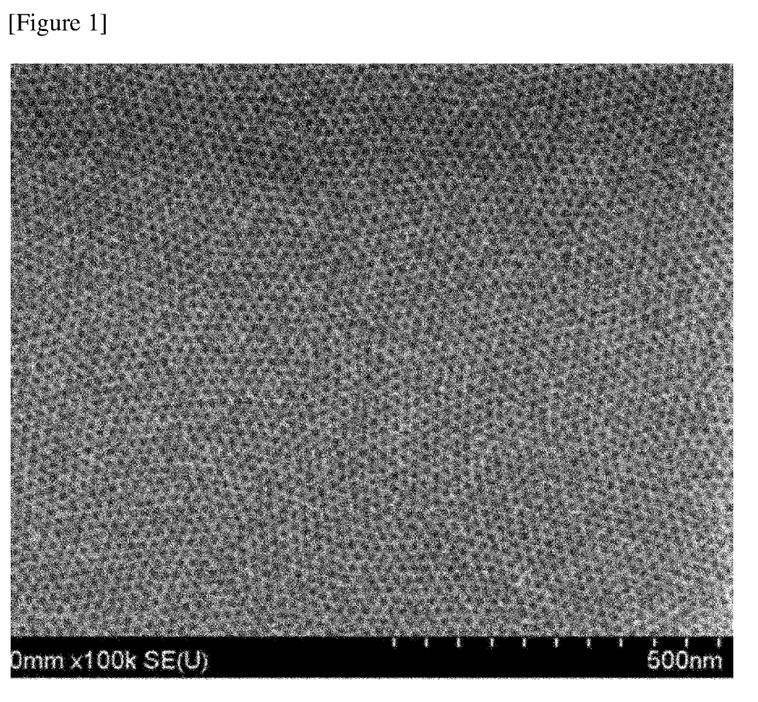
FIGS. 1 to 4 are SEM photographs of self-assembled polymer films of the block copolymers of Examples 1 to 4, respectively.
Figure 2:
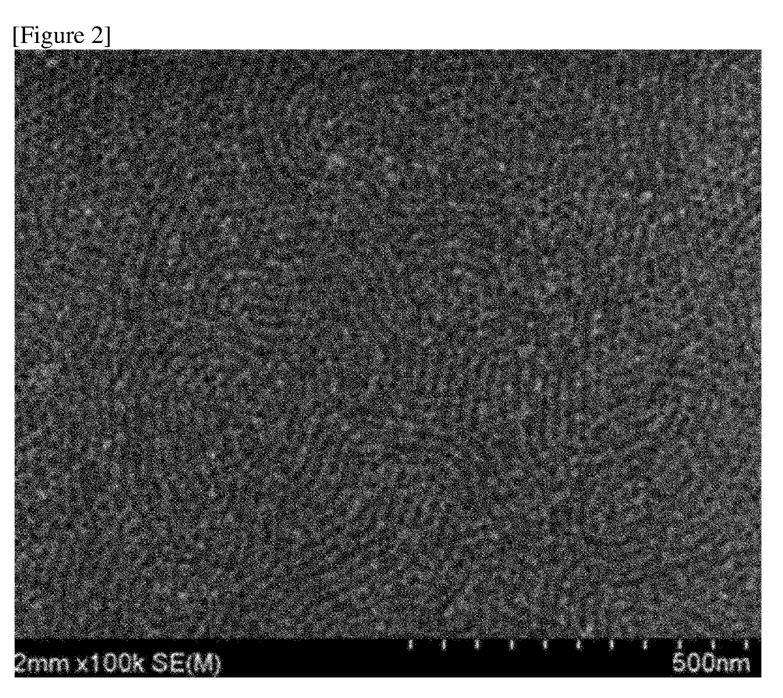
Figure 3:
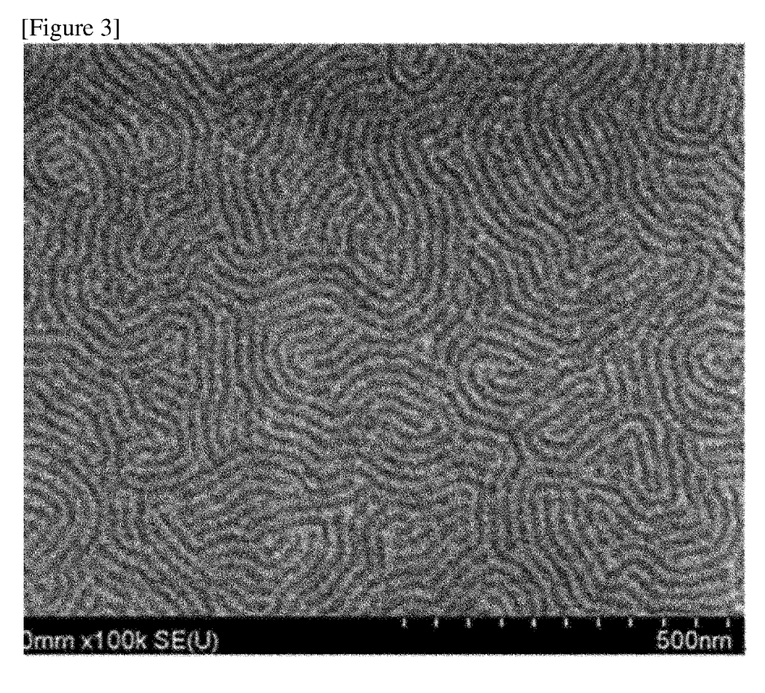
Figure 4:
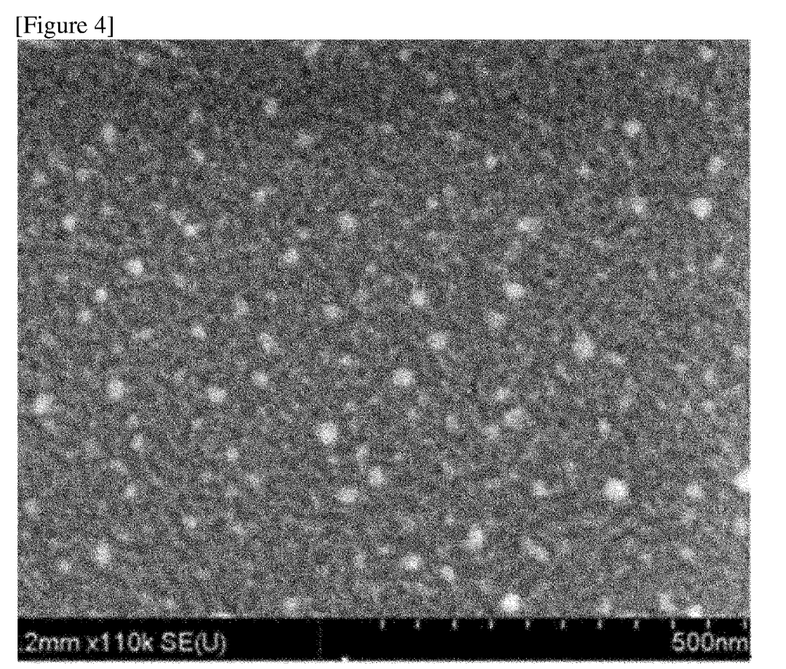
Figure 5:
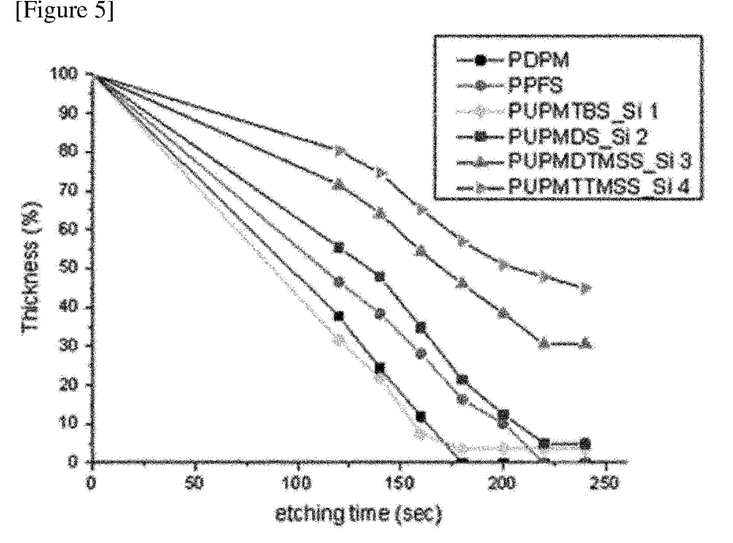
FIG. 5 is a comparison of the etching rates in the state where each block in the block copolymers of Examples is a homopolymer.

Each etching resistance of the homopolymers of Examples 1 to 4 was evaluated. The etching selectivity of each block was compared by etching the polymer films under the same condition (RF power: 25 W, pressure: 10 mTorr) using an etching machine. The results were described in FIG. 5. In FIG. 5, the graph indicated by PPFS is the etching rate of the polymer derived from the pentafluorostyrene monomer applied in Examples 1 to 4, the PUPMTBS is the etching rate of the polymer derived from the UPMTBS applied in Example 1, and the graph indicated by PUPMDS is the etching rate of the polymer derived from UPMDS of Example 2, the graph indicated by PUPMDTMSS is the etching rate of the polymer derived from the UPMDTMSS of Example 3, and the PUPMTTMSS is the etching rate of the polymer derived from the UPMTTMSS of Example 4.

The invention claimed is:
1. A block copolymer comprising a polymer segment A having a unit represented by Formula 1 below and a polymer segment B different from the polymer segment A:

[Formula 1]

wherein, R is hydrogen or an alkyl group having 1 to 4 carbon atoms, X is an oxygen atom, —C(=O)—$X_1$— or —$X_1$—C(=O)—, where $X_1$ is an oxygen atom or —$SiH_2$—, and Y is a monovalent substituent comprising an aromatic ring structure to which a linear hydrocarbon chain having 8 or more chain-forming atoms is linked, where a carbon atom of the linear hydrocarbon chain is optionally replaced with oxygen, nitrogen or sulfur, and the linear hydrocarbon chain is substituted with a hydrocarbon functional group containing one or more silicon atoms or iron atoms.

2. The block copolymer according to claim 1, wherein X is an oxygen atom, —C(=O)—O— or —O—C(=O)—.

3. The block copolymer according to claim 1, wherein X is —C(=O)—O—.

4. The block copolymer according to claim 1, wherein the linear hydrocarbon chain comprises 8 to 20 chain-forming atoms.

5. The block copolymer according to claim 1, wherein the chain-forming atom is carbon, oxygen, nitrogen or sulfur.

6. The block copolymer according to claim 1, wherein the chain-forming atom is carbon or oxygen.

7. The block copolymer according to claim 1, wherein Y is represented by Formula 2 below:

[Formula 2]

wherein, P is an arylene group, Q is a single bond, an oxygen atom or —$NR_3$—, where $R_3$ is hydrogen, an alkyl group, an alkenyl group, an alkynyl group, an alkoxy group or an aryl group, and Z is the linear hydrocarbon chain having 8 or more chain-forming atoms and substituted with a hydrocarbon functional group comprising one or more silicon atoms or iron atoms.

8. The block copolymer according to claim 1, wherein the hydrocarbon functional group is a functional group represented by Formula 4 below or a silsesquioxanyl group:

[Formula 4]

wherein, each of R is independently a hydrogen atom or an alkyl group, L is a single bond or an oxygen atom, and n is a number in a range of 0 to 10.

9. The block copolymer according to claim 1, wherein the polymer segment B comprises a unit of Formula 5 below

[Formula 5]

wherein, B is a monovalent substituent having an aromatic structure containing one or more halogen atoms.

10. The block copolymer according to claim 1, wherein the polymer segment B comprises a unit of Formula 6 below:

[Formula 6]

wherein, $X_2$ is a single bond, an oxygen atom, a sulfur atom, —S(=O)$_2$—, an alkylene group, an alkenylene group, an alkynylene group, —C(=O)—$X_1$— or —$X_1$—C(=O)—, where $X_1$ is a single bond, an oxygen atom, a sulfur atom, —S(=O)$_2$—, an alkylene group, an alkenylene group or an alkynylene group, and W is an aryl group containing at least one halogen atom.

11. The block copolymer according to claim 1, wherein the polymer segment B comprises a unit of Formula 7 below:

[Formula 7]

wherein, $X_2$ is a single bond, an oxygen atom, a sulfur atom, —S(=O)$_2$—, an alkylene group, an alkenylene group, an alkynylene group, —C(=O)—$X_1$— or —$X_1$—C(=O)—, where $X_1$ is a single bond, an oxygen atom, a sulfur atom, —S(=O)$_2$—, an alkylene group, an alkenylene group or an alkynylene group, and $R_1$ to $R_5$ are each independently hydrogen, an alkyl group, a haloalkyl group or a halogen atom, where the number of halogen atoms contained in $R_1$ to $R_5$ is 1 or more.

12. A polymer film comprising the block copolymer of claim 1, wherein the block copolymer is self-assembled.

13. A method for forming a polymer film, which comprises forming on a substrate a polymer film comprising the block copolymer of claim 1, wherein the block copolymer is self-assembled.

14. A patterning method comprising a process of selectively removing, from a laminate having a substrate, and a polymer film formed on the substrate and comprising the block copolymer of claim 1, any one of the polymer segments in the block copolymer, wherein the block copolymer is self-assembled.

15. The block copolymer according to claim 1, wherein the linear hydrocarbon chain is directly connected to the ring structure or is connected via a linker.

16. The block copolymer according to claim 15, wherein the linker is an oxygen atom, a sulfur atom, —NR$_1$—, —S(=O)$_2$—, a carbonyl group, an alkylene group, an alkenylene group, an alkynylene group, —C(=O)—$X_1$— or —$X_1$—C(=O)—, where $R_1$ is hydrogen, an alkyl group, an alkenyl group, an alkynyl group, an alkoxy group or an aryl group and $X_1$ is a single bond, an oxygen atom, a sulfur atom, —NR$_2$—, —S(=O)$_2$—, an alkylene group, an alkenylene group or an alkynylene group, and where $R_2$ is hydrogen, an alkyl group, an alkenyl group, an alkynyl group, an alkoxy group or an aryl group.

17. The block copolymer according to claim 1, wherein the hydrocarbon functional group is a trialkylsiloxy group, a butyldimethylsilane group, a trimethylsilane group, a dimethylsilylmethyltrimethylsilane group, a trimethylsilyltrisilane group or a silsesquioxanyl group.

18. The block copolymer according to claim 1, wherein the polymer segment A is present in a range of 10 mol % to 90 mol %.

* * * * *